(12) United States Patent
Xu et al.

(10) Patent No.: US 12,199,108 B2
(45) Date of Patent: Jan. 14, 2025

(54) DISPLAY PANEL AND DISPLAY DEVICE

(71) Applicant: Wuhan China Star Optoelectronics Technology Co., Ltd., Wuhan (CN)

(72) Inventors: Zuoyuan Xu, Wuhan (CN); Ronglei Dai, Wuhan (CN); Qiang Gong, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 17/602,793

(22) PCT Filed: Aug. 10, 2021

(86) PCT No.: PCT/CN2021/111659
§ 371 (c)(1),
(2) Date: Oct. 11, 2021

(87) PCT Pub. No.: WO2023/284046
PCT Pub. Date: Jan. 19, 2023

(65) Prior Publication Data
US 2024/0170500 A1     May 23, 2024

(30) Foreign Application Priority Data
Jul. 14, 2021   (CN) .......................... 202110796473.7

(51) Int. Cl.
*H01L 27/12*        (2006.01)
(52) U.S. Cl.
CPC ................................ *H01L 27/1244* (2013.01)
(58) Field of Classification Search
None
See application file for complete search history.

(56) References Cited

U.S. PATENT DOCUMENTS

| 6,882,397 B2 * | 4/2005 | Hayata | G02F 1/1345 |
| | | | 349/149 |
| 2004/0150765 A1 * | 8/2004 | Ueda | G02F 1/13452 |
| | | | 349/54 |

(Continued)

FOREIGN PATENT DOCUMENTS

| CN | 106298734 A | 1/2017 |
| CN | 107331294 A | 11/2017 |

(Continued)

OTHER PUBLICATIONS

International Search Report in International application No. PCT/CN2021/111659, mailed on Apr. 14, 2022.

(Continued)

*Primary Examiner* — Bilkis Jahan
(74) *Attorney, Agent, or Firm* — Nathan & Associates; Menachem Nathan

(57) ABSTRACT

The present disclosure discloses a display panel and a display device. The display panel comprises a driving chip and fan-out wires. Fan-out wires in a first fan-out wire group are electrically connected to corresponding output terminals through a second side of an adjacent driving chip; each of the fan-out wires in the first fan-out wire group comprises a first fan-out section and a second fan-out section that are connected and located on different layers. The present disclosure adopts a wire-changing jumper design to prevent signal disorder caused by inconsistent orders of the output terminals and the fan-out wires.

20 Claims, 7 Drawing Sheets

(56) References Cited

U.S. PATENT DOCUMENTS

| | | | | |
|---|---|---|---|---|
| 2005/0127531 A1* | 6/2005 | Tay | ............... | H01L 25/105 |
| | | | | 257/E25.023 |
| 2006/0238450 A1* | 10/2006 | Onodera | ............ | G02F 1/13452 |
| | | | | 345/60 |
| 2015/0199929 A1* | 7/2015 | Kim | ............... | G09G 3/006 |
| | | | | 324/762.01 |
| 2020/0066819 A1 | 2/2020 | Song et al. | | |
| 2020/0355972 A1* | 11/2020 | Jian | ............... | G02F 1/1368 |

FOREIGN PATENT DOCUMENTS

| | | | |
|---|---|---|---|
| CN | 109061961 | A | 12/2018 |
| CN | 109147574 | A | 1/2019 |
| CN | 109375706 | A | 2/2019 |
| CN | 109557734 | A | 4/2019 |
| CN | 109634003 | A | 4/2019 |
| CN | 109950222 | A | 6/2019 |
| CN | 209055780 | U | 7/2019 |
| CN | 111755476 | A | 10/2020 |
| CN | 112255850 | A | 1/2021 |
| EP | 1887629 | A2 | 2/2008 |

OTHER PUBLICATIONS

Written Opinion of the International Search Authority in International application No. PCT/CN2021/111659, mailed on Apr. 14, 2022.

Chinese Office Action issued in corresponding Chinese Patent Application No. 202110796473.7 dated Feb. 7, 2022, pp. 1-8.

\* cited by examiner

DISPLAY PANEL AND DISPLAY DEVICE

BACKGROUND OF DISCLOSURE

Field of Disclosure

The present disclosure relates to the field of display technology, in particular to a display panel and a display device.

Description of Prior Art

With development of full-screen display technology, a screen proportion of a current display is constantly increasing, and a lower frame of the display is getting smaller and smaller.

There are various ways to realize a narrow frame in the prior art. FIG. 1 is one of many ways in which a display panel in the prior art realizes a narrow frame. In a display panel 100' shown in FIG. 1, a fan-out area 104' is provided with a plurality of fan-out wires 107', a driving chip 105' comprises a plurality of output terminals 106', and signal lines of a display area 101' are electrically connected to the output terminals 106' through the fan-out wires 107'. Since the fan-out wires 107' connected to the output terminals 106' in a middle area of the driving chip 105' still have compressed spaces, and the fan-out wires 107' connected to the output terminals 106' located at left and right sides of the driving chip 105' can no longer be compressed further, a bonding area 103' of the display panel 100' is moved up as a whole by electrically connecting the fan-out wires 107' connected to the output terminals 106' at the left and right sides to the output terminals 106' through sides of the driving chip 105', which achieves a narrow frame.

However, in order to prevent a short circuit between the plurality of fan-out wires 107', it is necessary to electrically connect the fan-out wires 107' on an outer side to the output terminals 106' on an inner side, and electrically connect the fan-out wires 107' on the inner side to the output terminals 106' on the outer side. In this way, each of the fan-out wires 107' cannot be electrically connected to a corresponding output terminal 106', resulting in signal transmission disorder and poor display.

In summary, there is an urgent need to provide a new display panel and a display device to solve the above technical problem.

SUMMARY OF DISCLOSURE

The present disclosure provides a display panel and a display device to solve a technical problem that each fan-out wire cannot be electrically connected to a corresponding output terminal in an existing display panel, which causes signal transmission disorder and poor display.

To solve the above problem, the present disclosure provides technical solutions as follows:

The present disclosure provides a display panel, which comprises a substrate, wherein the substrate comprises a display area and a non-display area surrounding the display area, and the non-display area comprises a bonding area and a fan-out area connecting the bonding area and the display area;

wherein the bonding area is provided with a driving chip, the driving chip comprises a first side adjacent to the display area and two second sides connected to the first side, the driving chip comprises a plurality of output terminals, and the plurality of output terminals comprises at least a first output terminal group;

wherein the fan-out area is provided with a plurality of fan-out wires, and the plurality of the fan-out wires comprise at least a first fan-out wire group, and each of the plurality of fan-out wires in the first fan-out wire group extends from the fan-out area to the bonding area and is electrically connected to a corresponding output terminal in the first output terminal group through an adjacent second side; and wherein each of the plurality of fan-out wires in the first fan-out wire group comprises a first fan-out section and a second fan-out section that are connected to each other and located in different layers, each of the first fan-out sections is electrically connected to the display area, and each of the second fan-out sections is electrically connected to a corresponding output terminal in the first output terminal group.

According to the display panel provided by the present disclosure, the plurality of second fan-out sections are electrically connected to the corresponding output terminals in the first output terminal group through the adjacent second side; and the plurality of first fan-out sections are arranged along a preset direction, and ends of the plurality of second fan-out sections that are not connected to the first fan-out sections are arranged along the preset direction, in the preset direction, an arrangement sequence of each of the first fan-out sections is same as an arrangement sequence of correspondingly connected ends of the second fan-out sections that are not connected to the first fan-out sections; and wherein the preset direction is perpendicular to a direction in which the display area points to the fan-out area.

According to the display panel provided by the present disclosure, the plurality of first fan-out sections are connected to corresponding second fan-out sections through the adjacent second side, and the plurality of second fan-out sections are electrically connected to the corresponding output terminals in the first output terminal group; and ends of the plurality of first fan-out sections that are not connected to the second fan-out sections are arranged along a preset direction, and the plurality of second fan-out sections are arranged along the preset direction, in the preset direction, an arrangement sequence of each of the ends of the first fan-out sections that are not connected to the second fan-out sections is same as an arrangement sequence of correspondingly connected second fan-out sections; and the preset direction is perpendicular to a direction in which the display area points to the fan-out area.

According to the display panel provided by the present disclosure, the plurality of output terminals further comprise a second output terminal group, and the plurality of fan-out wires further comprise a second fan-out wire group; each fan-out wire of the second fan-out wire group is electrically connected to a corresponding output terminal in the second output terminal group.

According to the display panel provided by the present disclosure, the plurality of output terminals of the first output terminal group and a plurality of output terminals of the second output terminal group are along an extension direction of the first side, and the second output terminal group is disposed on a side of the first output terminal group away from the adjacent second side.

According to the display panel provided by the present disclosure, the plurality of output terminals of the first output terminal group and a plurality of output terminals of the second output terminal group are along an extension direction of the first side, and at least a part of the output terminals of the second output terminal group are disposed on a side of the first output terminal group close to the adjacent second side.

According to the display panel provided by the present disclosure, the plurality of output terminals of the first output terminal group are arranged along an extension direction of the adjacent second side, and a plurality of output terminals of the second output terminal group are arranged along an extension direction of the first side.

According to the display panel provided by the present disclosure, the output terminals of the second output terminal group are arranged along an extension direction of the first side, and the output terminals of the first output terminal group are located at a side of the output terminals of the second output terminal group away from the display area.

According to the display panel provided by the present disclosure, the display panel further comprises a test pad disposed on the substrate, the test pad comprises a first section and a second section, the first section is located in the fan-out area, and the second section is located in the bonding area.

According to the display panel provided by the present disclosure, an orthographic projection of the first section on the substrate overlaps an orthographic projection of the first fan-out sections on the substrate, and an orthographic projection of the second section on the substrate is located on a side of an orthographic projection of the second output terminal group on the substrate away from the display area.

According to the display panel provided by the present disclosure, the display panel further comprises a plurality of test pad connection wires for connecting the first section and the second section; there is a gap between two adjacent output terminals of the first output terminal group, and at least a part of the test pad connection wires are connected to the second section through the gap from a side of the first side close to the display area.

According to the display panel provided by the present disclosure, the driving chip further comprises a third side far away from the display area; and the driving chip further comprises a plurality of input terminals, and the plurality of input terminals are arranged along an extension direction of the third side.

According to the display panel provided by the present disclosure, the output terminals of the second output terminal group are arranged along an extension direction of the first side, and the output terminals of the first output terminal group are arranged along the extension direction of the third side.

According to the display panel provided by the present disclosure, at least a part of the output terminals of the first output terminal group are arranged between the plurality of the input terminals.

According to the display panel provided by the present disclosure, the display panel further comprises a flexible circuit board disposed on a side of the driving chip away from the display area, and the flexible circuit board is electrically connected to the input terminals.

The present disclosure provides a display device, which comprises a display panel, wherein the display panel comprises a substrate, the substrate comprises a display area and a non-display area surrounding the display area, and the non-display area comprises a bonding area and a fan-out area connecting the bonding area and the display area;

wherein the bonding area is provided with a driving chip, the driving chip comprises a first side adjacent to the display area and two second sides connected to the first side, the driving chip comprises a plurality of output terminals, and the plurality of output terminals comprises at least a first output terminal group;

wherein the fan-out area is provided with a plurality of fan-out wires, and the plurality of the fan-out wires comprise at least a first fan-out wire group, and each of the fan-out wires in the first fan-out wire group extends from the fan-out area to the bonding area and is electrically connected to a corresponding output terminal in the first output terminal group through an adjacent second side; and wherein each of the fan-out wires in the first fan-out wire group comprises a first fan-out section and a second fan-out section that are connected to each other and located in different layers, each of the first fan-out sections is electrically connected to the display area, and each of the second fan-out sections is electrically connected to a corresponding output terminal in the first output terminal group.

According to the display device provided by the present disclosure, the plurality of second fan-out sections are electrically connected to the corresponding output terminals in the first output terminal group through the adjacent second side; and the plurality of first fan-out sections are arranged along a preset direction, and ends of the plurality of second fan-out sections that are not connected to the first fan-out sections are arranged along the preset direction, in the preset direction, an arrangement sequence of each of the first fan-out sections is same as an arrangement sequence of correspondingly connected ends of the second fan-out sections that are not connected to the first fan-out sections; and wherein the preset direction is perpendicular to a direction in which the display area points to the fan-out area.

According to the display device provided by the present disclosure, the plurality of first fan-out sections are connected to the corresponding second fan-out sections through the adjacent second side, and the plurality of second fan-out sections are electrically connected to the corresponding output terminals in the first output terminal group; and ends of the plurality of first fan-out sections that are not connected to the second fan-out sections are arranged along a preset direction, and the plurality of second fan-out sections are arranged along the preset direction, in the preset direction, an arrangement sequence of each of the ends of the first fan-out sections that are not connected to the second fan-out sections is same as an arrangement sequence of correspondingly connected second fan-out sections; and the preset direction is perpendicular to a direction in which the display area points to the fan-out area.

According to the display device provided by the present disclosure, the plurality of output terminals further comprise a second output terminal group, and the plurality of fan-out wires further comprise a second fan-out wire group; each fan-out wire of the second fan-out wire group is electrically connected to a corresponding output terminal in the second output terminal group.

According to the display device provided by the present disclosure, the plurality of output terminals of the first output terminal group and a plurality of output terminals of the second output terminal group are along an extension direction of the first side, and the second output terminal group is disposed on a side of the first output terminal group away from the adjacent second side.

Beneficial effects of the present disclosure are: in the display panel and the display device provided by the embodiments of the present disclosure, the plurality of fan-out wires are disposed in the fan-out area of the display panel, and the plurality of fan-out wires comprise at least the first fan-out wire group. Each fan-out wire in the first fan-out group extends from the fan-out area to the bonding area, and is electrically connected to the corresponding output terminal in the first output terminal group through the adjacent second side. Each fan-out wire in the first fan-out wire group of the present disclosure adopts the wire-changing jumper design, and each fan-out wire in the first fan-out wire group comprises the first fan-out section and the second fan-out section that are connected and located on different layers, each first fan-out section is electrically connected to the display area, and each second fan-out section is electrically connected to the corresponding output terminal in the first output terminal group. Under the premise of realizing the narrow frame, the fan-out wires are electrically connected to the corresponding output terminals, which prevents a short circuit between the plurality of fan-out wires, and prevents poor display caused by signal disorder due to inconsistent orders of the output terminals and the fan-out wires.

DESCRIPTION OF DRAWINGS

In order to more clearly explain the technical solutions in the embodiments of the present disclosure, the following will briefly introduce the drawings required in the description of the embodiments. Obviously, the drawings in the following description are only some embodiments of the present disclosure. For those skilled in the art, without paying any creative work, other drawings can be obtained based on these drawings.

DESCRIPTION OF REFERENCE SIGNS

Figure 1:
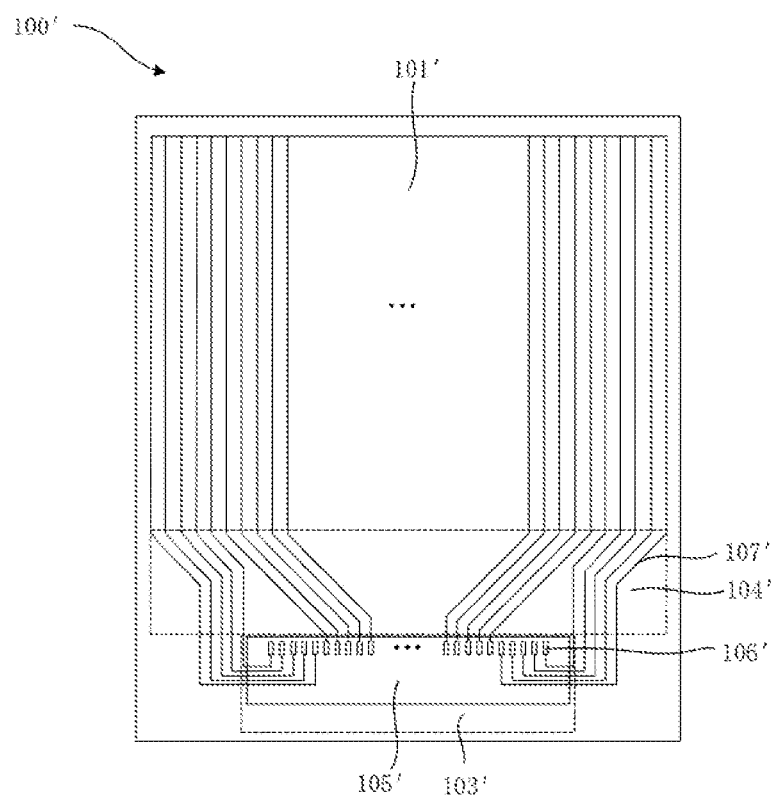
FIG. 1 is a schematic diagram of a planar structure of a conventional display panel.

100', display panel; 103', bonding area; 104', fan-out area; 105', driving chip; 106', output terminal; 107', fan-out wire; 100, display panel; 101, display area; 102, non-display area; 103, bonding area; 104, fan-out area; 105, driving chip; 1051, first side; 1052, second side; 1053, third side; 106, output terminal; 107, fan-out wire; 1071, first fan-out section; 1072, second fan-out section; 108, input terminal; 1091, first section; 1092, second section; 110, flexible circuit board; 111, first signal wire; 112, second signal wire; 113, test pad connection wire;

10, first output terminal group; 11, first fan-out wire group; 12, second output terminal group; 13, second fan-out wire group;

1, substrate; 2, first metal layer; 21, gate; 3, gate insulating layer; 31, insulating layer; 32, connecting hole; 4, semiconductor layer; 5, second metal layer; 51, source; 52, drain.

DETAILED DESCRIPTION OF EMBODIMENTS

Technical solutions in embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure. In addition, it should be understood that the specific implementations described here are only used to illustrate and explain the present disclosure, and are not used to limit the present disclosure. In the present disclosure, unless otherwise stated, directional words used such as "upper" and "lower" generally refer to upper and lower directions of a device in actual use or working state, and specifically refer to the drawing directions in the drawings; and "inner" and "outer" refer to an outline of the device.

Figure 2:
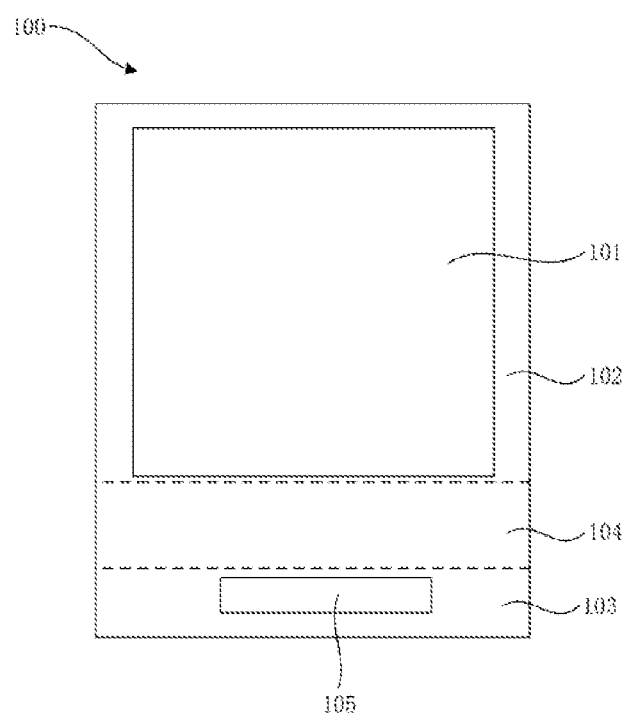
FIG. 2 is a schematic diagram of a simplified planar structure of a display panel provided by an embodiment of the present disclosure.
Figure 3:
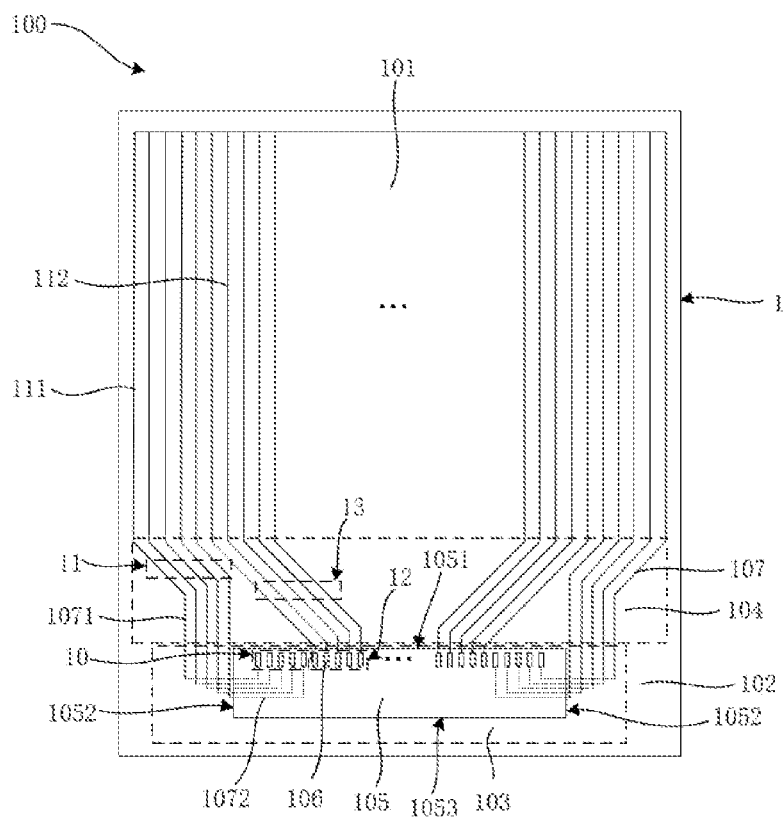
FIG. 3 is a schematic diagram of a planar structure of the display panel provided by the embodiment of the present disclosure.

Please refer to FIGS. 2 and 3. FIG. 2 is a schematic diagram of a simplified planar structure of a display panel provided by an embodiment of the present disclosure, and FIG. 3 is a schematic diagram of a planar structure of the display panel provided by the embodiment of the present disclosure.

An embodiment of the present disclosure provides a display panel 100. The display panel 100 comprises a substrate 1. The substrate 1 comprises a display area 101 and a non-display area 102 surrounding the display area 101, and the non-display area 102 comprises a bonding area 103 and a fan-out area 104 connecting to the bonding area 103 and the display area 101, and the fan-out area 104 is located between the display area 101 and the bonding area 103.

The bonding area 103 is provided with a driving chip 105, the driving chip 105 comprises a first side 1051 close to the display area 101 and two second sides 1052 connected to the first side 1051, and the two second sides 1052 are arranged oppositely. The driving chip 105 comprises a plurality of output terminals 106, and the plurality of output terminals 106 constitute a first output terminal group 10.

The fan-out area 104 is provided with a plurality of fan-out wires 107, and the plurality of the fan-out wires 107 comprise at least a first fan-out wire group 11, and each fan-out wire 107 in the first fan-out wire group 11 extends from the fan-out area 104 to the bonding area 103, and is electrically connected to a corresponding output terminal 106 in the first output terminal group 10 through an adjacent second side 1052.

Alternatively, a shape of the driving chip 105 is a rectangle, the first side 1051 and the second sides 1052 are perpendicular to each other, and the two second sides 1052 are parallel to each other.

On the one hand, in order to prevent a short circuit between the plurality of fan-out wires 107 in the first fan-out wire group 11, there is no contact between each fan-out wire 107 in the first fan-out wire group 11. On the other hand, it is also necessary to prevent poor display caused by disordered signal transmission between the output terminals 106 and the fan-out wires 107 in the first fan-out wire group 11. Each fan-out wire 107 in each fan-out wire group 11 needs to be electrically connected to the corresponding output terminal 106 in the first output terminal group 10, so that the fan-out wires 107 on the outer side need to be electrically connected to the output terminals 106 located on the outer side, and the fan-out wires 107 located on the inner side are electrically connected with the output terminals 106 located on the inner side. Further, the fan-out wires 107 in the first fan-out wire group 11 located on the outer side need to be electrically connected to the output terminals 106 in the first output terminal group 10 located on the outer side, and the fan-out wires 107 in the first fan-out wire group 11 on the inner side are electrically connected to the output terminals 106 in the first output terminal group 10 located on the inner side.

In view of this, the embodiment of the present disclosure achieves the above-mentioned purpose by adopting a wire-changing jumper for the plurality of the fan-out wires 107 in the first fan-out wire group 11, and specific solutions are described as follows.

Each fan-out wire 107 in the first fan-out wire group 11 comprises a first fan-out section 1071 and a second fan-out section 1072 that are connected to each other and located in different layers to ensure that even if there is no contact between the first fan-out section 1071 and the second fan-out section 1072, the first fan-out section 1071 and the second fan-out section 1072 overlap in a plane direction perpendicular to the display panel, so as to prevent the short circuit between the plurality of fan-out wires 107 in the first fan-out wire group 11.

Each first fan-out section 1071 is electrically connected to the display area 101, and each second fan-out section 1072 is electrically connected to a corresponding output terminal 106 in the first output terminal group 10. That is to say, the display area 101 is electrically connected to the first fan-out section 1071 first, and then is electrically connected to the output terminal 106 in the first output terminal group 10 through the second fan-out section 1072.

It is understandable that, compared to the prior art in which every part of each fan-out wire 107 in the first fan-out wire group 11 is located in a same film layer, each fan-out wire 107 in the present disclosure can be electrically connected to the corresponding output terminal 106, so that the poor display caused by signal transmission disorder due to the inconsistency of an order of the two can be prevent.

Figure 4:
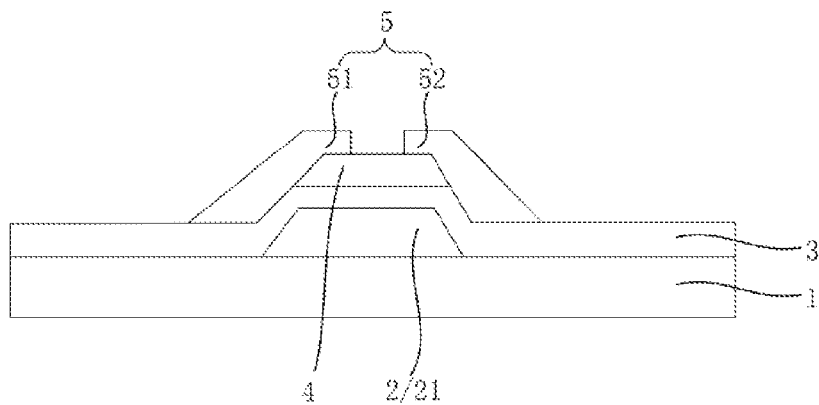
FIG. 4 is a schematic diagram of a cross-sectional structure of a display area of the display panel in FIG. 3.

In order to more clearly illustrate a structure of the fan-out wires 107 in the first fan-out wire group 11, a structure of the display panel 100 in the embodiment of the present disclosure will be described below with reference to FIG. 4, which is a schematic diagram of a cross-sectional structure of the display area 101 of the display panel 100 provided by the embodiment of the present disclosure.

It should be noted that the display panel 100 in the embodiment of the present disclosure may be a bottom-gate display panel or a top-gate display panel, and the present disclosure is not limited to this. In order to clearly describe the technical solutions in the present disclosure, the embodiment of the present disclosure takes the display panel 100 as the bottom-gate display panel as an example for illustration.

Specifically, the display panel 100 comprises the substrate 1 and a thin film transistor array layer, the thin film transistor array layer is disposed on the substrate 1 and comprises a plurality of thin film transistors distributed in an array and a plurality of signal wires. The substrate 1 can be made of any suitable insulating material with flexibility, and can be transparent, translucent, or opaque.

The thin film transistor array layer comprises a first metal layer 2, a gate insulating layer 3, a semiconductor layer 4, and a second metal layer 5. Specifically, the first metal layer 2 is located on the substrate 1 and comprises a gate 21 and scan signal wires (not shown in the figures) and the like. The gate insulating layer 3 is located on the first metal layer 2, and covers the substrate 1 and the gate 21. The semiconductor layer 4 is located on the gate insulating layer 3, and a material of the semiconductor layer 4 may be low-temperature polysilicon or amorphous silicon. The second metal layer 5 is located on the semiconductor layer 4 and covers the gate insulating layer 3 and the semiconductor layer 4, and the second metal layer 5 comprises a source 51, a drain 52, and data signal wires (not shown in the figures).

Specifically, materials of the first metal layer 2 and the second metal layer 5 may be same or different. The materials of the first metal layer 2 may comprise a single layer or multiple layers of gold (Au), silver (Ag), copper (Cu), nickel (5i), platinum (Pt), palladium (Pd), aluminum (Al), molybdenum (Mo), or a chromium (Cr), or an alloy such as aluminum (Al): neodymium (5d) alloy, molybdenum (Mo): tungsten (W) alloy; and the materials of the second metal layer 5 may comprise a single layer or multiple layers of gold (Au), silver (Ag), copper (Cu), nickel (5i), platinum (Pt), palladium (Pd), aluminum (Al), molybdenum (Mo) or chromium (Cr), or an alloy such as aluminum (Al): neodymium (5d) alloy, molybdenum (Mo): tungsten (W) alloy.

Figure 5:
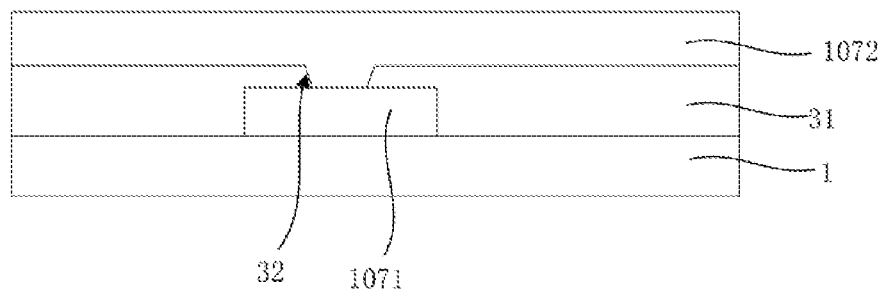
FIG. 5 is a schematic diagram of a cross-sectional structure of a non-display area of the display panel in FIG. 3.

As an embodiment, please refer to FIG. 5. FIG. 5 is a schematic diagram of a cross-sectional structure of the non-display area of the display panel in FIG. 3.

Specifically, the first fan-out sections 1071 are located on the substrate 1, and the second fan-out sections 1072 are located on a side of the first fan-out sections 1071 away from the substrate 1, that is, the first fan-out sections 1071 are disposed in a same layer as the first metal layer 2, and the second fan-out sections 1072 are disposed in a same layer as the second metal layer 5. Alternatively, in other embodiments, the second fan-out sections 1072 are located on the substrate 1, and the first fan-out sections 1071 are located on a side of the second fan-out sections 1072 away from the substrate 1, that is, the first fan-out sections 1071 are disposed in a same layer with the second metal layer 5, and the second fan-out sections 1072 are disposed in a same layer as the first metal layer 2.

Further, an insulating layer 31 is also provided between the first fan-out sections 1071 and the second fan-out sections 1072 to prevent a short circuit between the first fan-out sections 1071 and the second fan-out sections 1072. The first fan-out sections 1071 and the second fan-out sections 1072 are electrically connected through connecting holes 32 opened in the insulating layer 31. The insulating layer 31 and the gate insulating layer 3 are disposed in a same layer and are prepared through a same process.

Please refer to FIG. 6 to FIG. 13. FIG. 6 to FIG. 13 are schematic diagrams of various partial structures of the non-display area of the display panel provided by embodiments of the present disclosure.

Specifically, the first fan-out wire group 11 in FIGS. 6 to 13 comprises the plurality of fan-out wires 107, and the first output terminal group 10 comprises the plurality of output terminals 106. It should be noted that, for the convenience of description, the embodiment of the present disclosure assumes that the first fan-out wire group 11 comprises five fan-out wires 107, and the first output terminal group 10 comprises five output terminals 106 as an example for description, but the present disclosure should not be limited by this.

Various embodiments provided in FIGS. 6 to 13 will be described one by one below.

Figure 6:
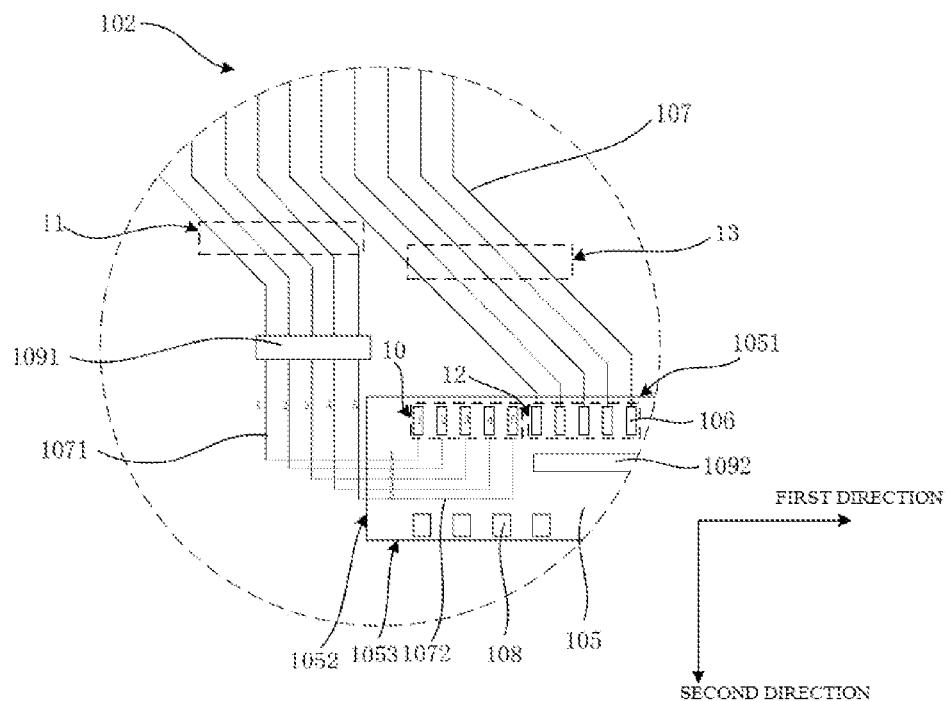
FIG. 6 is a schematic diagram of a first partial structure of the non-display area of the display panel provided by an embodiment of the present disclosure.

As an embodiment, please refer to FIG. 6. FIG. 6 is a schematic diagram of a first partial structure of the non-display area of the display panel provided by an embodiment of the present disclosure.

Specifically, the plurality of second fan-out sections 1072 are electrically connected to corresponding output terminals 106 in the first output terminal group 10 through an adjacent second side 1052. The plurality of first fan-out sections 1071 are arranged along a preset direction, and ends of the plurality of second fan-out sections 1072 that are not connected to the first fan-out sections 1071 are arranged along the preset direction. In the preset direction, an arrangement sequence of each of the first fan-out sections 1071 is same as an arrangement sequence of ends of correspondingly connected second fan-out sections 1072 that are not connected to the first fan-out sections 1071.

Specifically, the preset direction is perpendicular to a direction in which the display area 101 points to the fan-out area 104, the preset direction may refer to a first direction in FIG. 6, and the direction in which the display area 101 points to the fan-out area may refer to a second direction in FIG. 6. The first direction and the second direction in FIGS. 7 to 13 are the same, and the description will not be repeated below.

Generally, an extension direction of the first side 1051 is perpendicular to the direction in which the display area 101 points to the fan-out area 104, therefore the preset direction may be parallel to the extension direction of the first side 1051.

Specifically, the first fan-out section 1071 of the first fan-out wire, the first fan-out section 1071 of the second fan-out wire . . . the first fan-out section 1071 of the fifth fan-out wire are arranged in the preset direction in sequence. An end of the second fan-out section 1072 of the first fan-out wire that is not connected to the first fan-out section 1071, and an end of the second fan-out section 1072 of the second fan-out wire that is not connected to the first fan-out section 1071 . . . an end of the second fan-out section 1072 of the fifth fan-out wire that is not connected to the first fan-out section 1071 are arranged in sequence along the preset direction. A first output terminal, a second output terminal . . . and a fifth output terminal of the first output terminal group 10 are arranged in order along the extension direction of the first side 1051. The first fan-out section of the first fan-out wire is electrically connected to the first output terminal through the second fan-out section 1072 of the first fan-out wire, the first fan-out section 1071 of the second fan-out wire is electrically connected to the second output terminal through the second fan-out section 1072 of the second fan-out wire . . . the first fan-out section 1071 of the fifth fan-out wire is electrically connected to the fifth output terminal through the second fan-out section 1072 of the fifth fan-out wire.

It is understandable that the embodiment of the present disclosure adopts the wire-changing jumper design, so that on the premise of preventing a short circuit between the fan-out wires 107, each fan-out wire 107 of the first fan-out wire group 11 can be connected to the corresponding output terminal 106 in the first output terminal group 10, and therefore each fan-out wire 107 can be electrically connected to the corresponding output terminal 106, thereby preventing poor display caused by disordered signal transmission due to the inconsistency of the order of the two.

Figure 7:
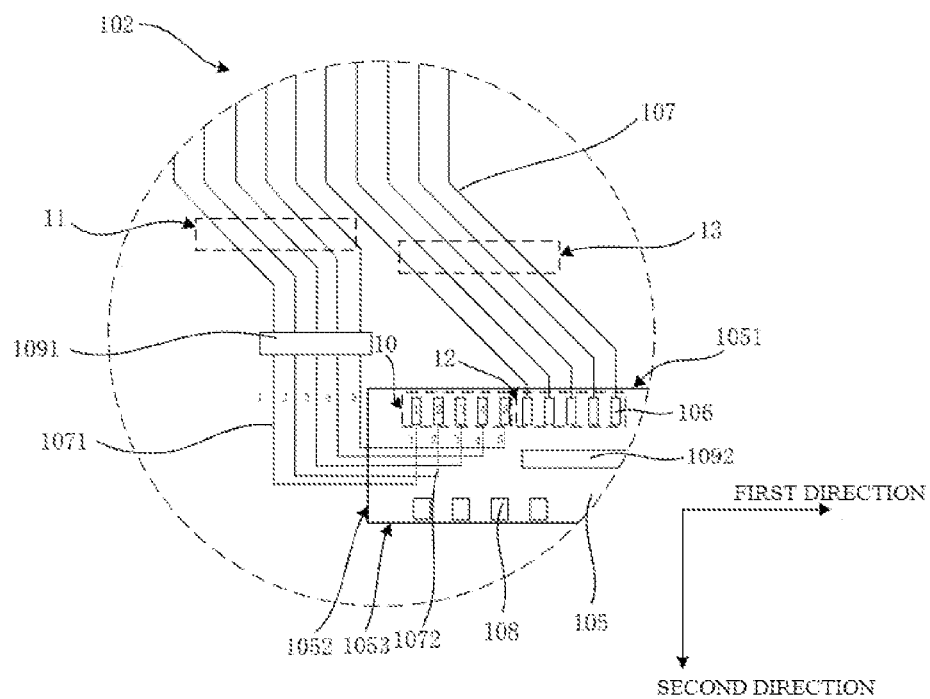
FIG. 7 is a schematic diagram of a second partial structure of the non-display area of the display panel provided by an embodiment of the present disclosure.

As an embodiment, please refer to FIG. 7. FIG. 7 is a schematic diagram of a second partial structure of the non-display area of the display panel provided by an embodiment of the present disclosure.

Specifically, the plurality of first fan-out sections 1071 are connected to corresponding second fan-out sections 1072 through an adjacent second side edge 1052, and the plurality of second fan-out sections 1072 are electrically connected to corresponding output terminals 106 in the first output terminal group 10. The ends of the plurality of first fan-out sections 1071 that are not connected to the second fan-out sections 1072 are arranged along the preset direction, and the plurality of second fan-out sections 1072 are arranged along the preset direction. In the preset direction, a sequence of the ends of the first fan-out section 1071 that are not connected to the second fan-out sections 1072 is same as a sequence of the correspondingly connected second fan-out sections 1072.

Specifically, the end of the first fan-out section 1071 of the first fan-out wire that is not connected to the second fan-out section 1072, and the end of the first fan-out section 1071 of the second fan-out wire that is not connected to the second fan-out section 1072 . . . the end of the first fan-out section 1071 of the fifth fan-out wire that is not connected to the second fan-out section 1072 are arranged in sequence along the preset direction. The second fan-out section 1072 of the first fan-out wire, the second fan-out section 1072 of the second fan-out wire . . . the second fan-out section 1072 of the fifth fan-out wire are arranged in sequence along the preset direction. The first output terminal, the second output terminal . . . and the fifth output terminal of the first output terminal group 10 are arranged in sequence along the extension direction of the first side 1051. Wherein, the first fan-out section 1071 of the first fan-out wire is electrically connected to the first output terminal through the second fan-out section 1072 of the first fan-out wire, the first fan-out section of the second fan-out wire 1071 is electrically connected to the second output terminal through the second fan-out section 1072 of the second fan-out wire . . . the first fan-out section of the fifth fan-out wire 1071 is electrically connected to the fifth output terminal through the second fan-out section 1072 of the fifth fan-out wire.

It is understandable that the embodiment of the present disclosure adopts the wire-changing jumper design, so that on the premise of preventing the short circuit between the fan-out wires 107, each fan-out wire 107 of the first fan-out wire group 11 can be connected to the corresponding output terminal 106 in the first output terminal group 10, and therefore each fan-out wire 107 can be electrically connected to the corresponding output terminal 106, thereby preventing poor display caused by disordered signal transmission due to the inconsistency of the order of the two.

Further, the first fan-out wire located on the outermost side is electrically connected to the first output terminal closest to the second side 1052, and the fifth fan-out wire located on the innermost side is electrically connected to the fifth output terminal the furthest away from the second side 1052, so that a length of the first fan-out wire on the outermost side can be reduced. Since an impedance of the fan-out wire is positively related to the length, the design of the present disclosure can reduce the impedance of the first fan-out wire on the outermost side.

In the same way, lengths of the 2/3/4 fan-out wires located between the first fan-out wire and the fifth fan-out wire are close to the lengths of the first fan-out wire and the fifth fan-out wire, and impedances also approach. Therefore, compared with the prior art that the fan-out wires 107 in the first fan-out wire group 11 are located in the same film layer, the impedances of the plurality of fan-out wires 107 in the first fan-out wire group 11 in the present disclosure are approximately equal, so that uniformity of impedance can be achieved, which is beneficial to improve uniformity of signal transmission.

Please continue to refer to FIGS. 6 and 7, the plurality of output terminals 106 further comprise a second output terminal group 12, and the plurality of fan-out wires 107 further comprise a second fan-out wire group 13, and each fan-out wire 107 of the second fan-out wire group 13 is electrically connected to a corresponding output terminal 106 in the second output terminal group 12. The plurality of fan-out wires 107 of the second fan-out wire group 13 are consistent with the design of the fan-out wires in the prior art and are arranged in a single layer.

Specifically, the plurality of output terminals 106 of the first output terminal group 10 and the plurality of output terminals 106 of the second output terminal group 12 are arranged along the extension direction of the first side 1051, so that the second output terminal group 12 is arranged on a side of the first output terminal group 10 away from the second side 1052. Compared with existing conventional driving chips, an arrangement sequence of the plurality of output terminals 106 of the driving chip 105 in the present disclosure is fixed without any change. An arrangement sequence of the fan-out wires 107 is same as an arrangement sequence of the output terminals 106, so that each fan-out wire 107 can be electrically connected to the corresponding output terminal 106, which prevents poor display caused by disordered signal transmission due to the inconsistency of the order of the two. Therefore, the display panel 100 of the present disclosure can directly emulate the existing conventional driving chips, and there is no need to design the arrangement sequence of the output terminals of the driving chips separately, which saves costs and facilitates mass production of products.

Further, for the display panel 100 adopting a newly designed driving chip 105, the technical solution provided in the present disclosure is also applicable. The following will illustrate structures of the display panel 100 that may be involved in the embodiments of the present disclosure. Regarding the structure of the fan-out wires 107 of the first fan-out wire group 11 and the connection relationship with the output terminals 106 of the first output terminal group 10, please refer to the foregoing discussion content, which will not be repeated here.

Figure 8:
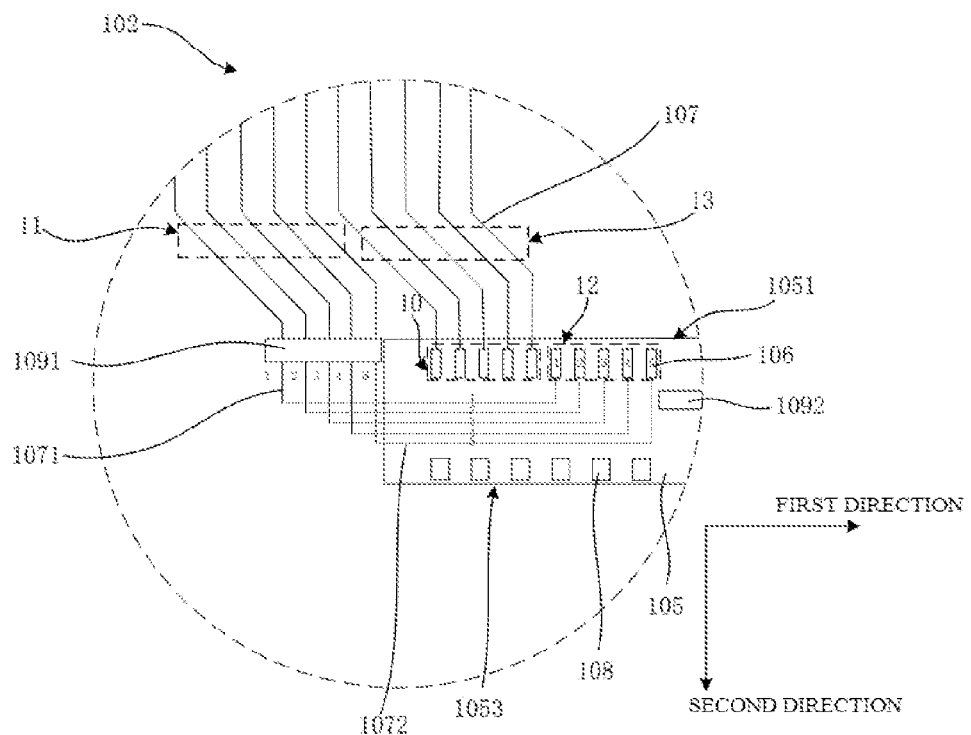
FIG. 8 is a schematic diagram of a third partial structure of the non-display area of the display panel provided by an embodiment of the present disclosure.

As an embodiment, please refer to FIG. 8. FIG. 8 is a schematic diagram of a third partial structure of the non-display area of the display panel provided by an embodiment of the present disclosure.

Specifically, the plurality of output terminals 106 of the first output terminal group 10 and the plurality of output terminals 106 of the second output terminal group 12 are arranged along the extension direction of the first side 1051, at least a part of the output terminals 106 of the second output terminal group 12 are arranged on a side of the first output terminal group 10 close to the adjacent second side 1052.

It can be understood that since the output terminals 106 of the second output terminal group 12 are located in a middle area of the driving chip 105, the output terminals 106 of the first output terminal group 10 are located on left and right sides of the driving chip 105, the fan-out wires 107 in the second fan-out wire group 13 to which the output terminals 106 of the second output terminal group 12 are connected still have space for compression, and the fan-out wires 107 in the first fan-out wire group 11 connected to the output terminals 106 of the first output terminal group 10 cannot be further compressed. Therefore, in the embodiment of the present disclosure, at least a part of the output terminals 106 of the second output terminal group 12 are arranged on a side of the first output terminal group 10 close to the second side 1052, so that the bonding area 103 is further moved upward as a whole, which can reduce a lower frame of the display panel 100.

Figure 9:
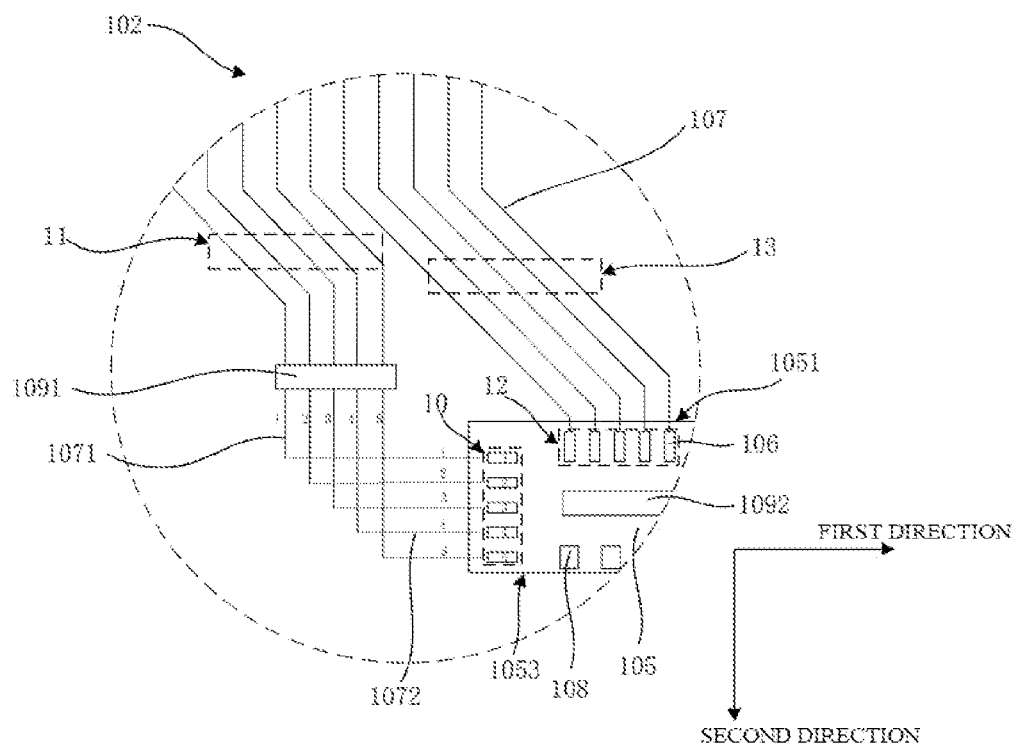
FIG. 9 is a schematic diagram of a fourth partial structure of a non-display area of the display panel provided by an embodiment of the present disclosure.

As an embodiment, referring to FIG. 9, which is a schematic diagram of a fourth partial structure of the non-display area of the display panel provided by an embodiment of the present disclosure.

Specifically, the plurality of output terminals 106 of the first output terminal group 10 are arranged along the extension direction of an adjacent second side 1052, and the plurality of output terminals 106 of the second output terminal group 12 are arranged along the extension direction of the first side 1051.

Specifically, the first output terminal, the second output terminal . . . the fifth output terminal of the first output terminal group 10 are arranged in sequence along the preset direction (the second direction), and the first fan-out section of the first fan-out wire is electrically connected to the first output terminal through the second fan-out section 1072 of the first fan-out wire, the first fan-out section 1071 of the second fan-out wire is electrically connected to the second output terminal through the second fan-out section 107 of the second fan-out wire . . . the first fan-out section 1071 of the fifth fan-out wire is electrically connected to the fifth output terminal through the second fan-out section 1072 of the fifth fan-out wire.

Figure 10:
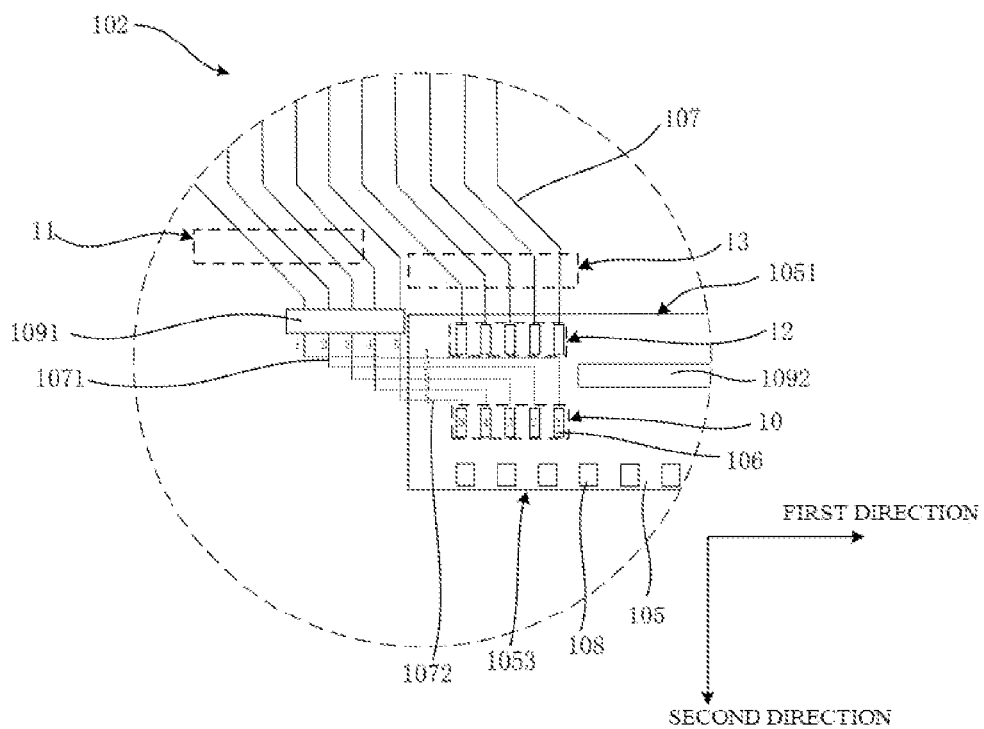
FIG. 10 is a schematic diagram of a fifth partial structure of the non-display area of the display panel provided by an embodiment of the present disclosure.

As an embodiment, please refer to FIG. 10, which is a schematic diagram of a fifth partial structure of the non-display area of the display panel provided by an embodiment of the present disclosure.

Specifically, the output terminals 106 of the second output terminal group 12 are arranged along the extension direction of the first side 1051, and the output terminals 106 of the first output terminal group 10 are located on a side of the output terminals 106 of the second output terminal group 12 away from the display area 101.

That is to say, the output terminals 106 of the first output terminal group 10 and the output terminals 106 of the second output terminal group 12 are arranged side by side. In the extension direction of the first side 1051 (the first direction), an arrangement sequence of the output terminals 106 of the first output terminal group 10 and an arrangement sequence of the output terminals 106 of the second output terminal group 12 are reversed.

Specifically, the first output terminal, the second output terminal . . . and the fifth output terminal of the first output terminal group 10 are arranged in sequence in an opposite direction of the first direction, and the first fan-out section 1071 of the first fan-out wire is electrically connected to the first output terminal through the second fan-out section 1072 of the first fan-out wire, the first fan-out section 1071 of the second fan-out wire is electrically connected to the second output terminal through the second fan-out section 1072 of the second fan-out wire . . . the first fan-out section 1071 of the fifth fan-out wire is electrically connected to the fifth output terminal through the second fan-out section 1072 of the fifth fan-out wire.

Further, referring to FIGS. 2 to 12, the driving chip 105 further comprises a third side 1053 away from the display area 101, and the third side 1053 is disposed opposite to the first side 1051, so the third side 1053 is connected to the two second sides 1052. The driving chip 105 further comprises a plurality of input terminals 108 for transmitting external signals to the output terminals 106, and the plurality of input terminals 108 are arranged along an extension direction of the third side 1053.

Figure 11:
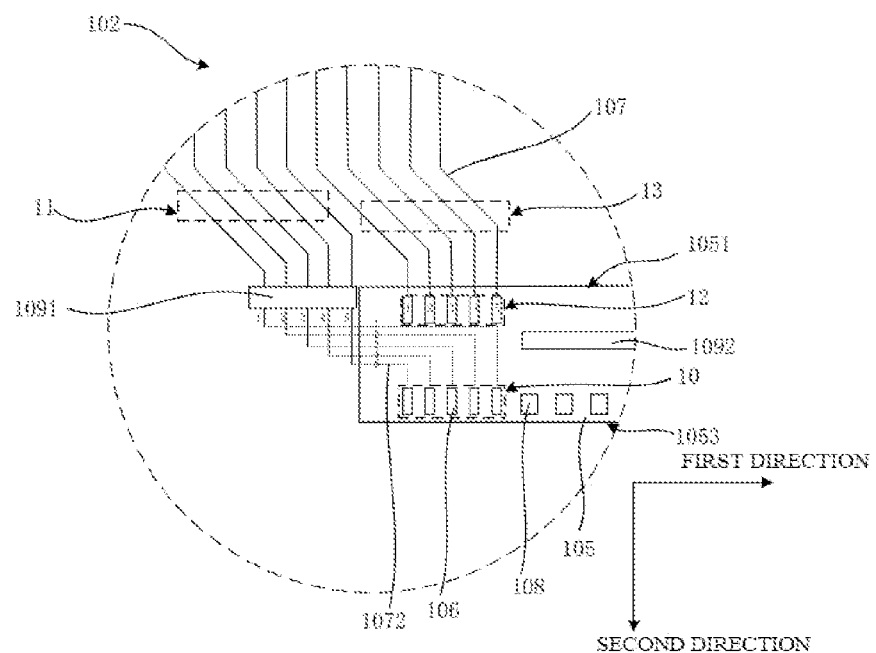
FIG. 11 is a schematic diagram of a sixth partial structure of the non-display area of the display panel provided by an embodiment of the present disclosure.

As an embodiment, please refer to FIG. 11. FIG. 11 is a schematic diagram of a sixth partial structure of the non-display area of the display panel provided by an embodiment of the present disclosure.

Specifically, the output terminals 106 of the second output terminal group 12 are arranged along the extension direction of the first side 1051, and the output terminals 106 of the first output terminal group 10 are arranged along the extension direction of the third side 1053, and the second output terminal group 12 is located on a side of the input terminals 108 close to the second side 1052.

Figure 12:
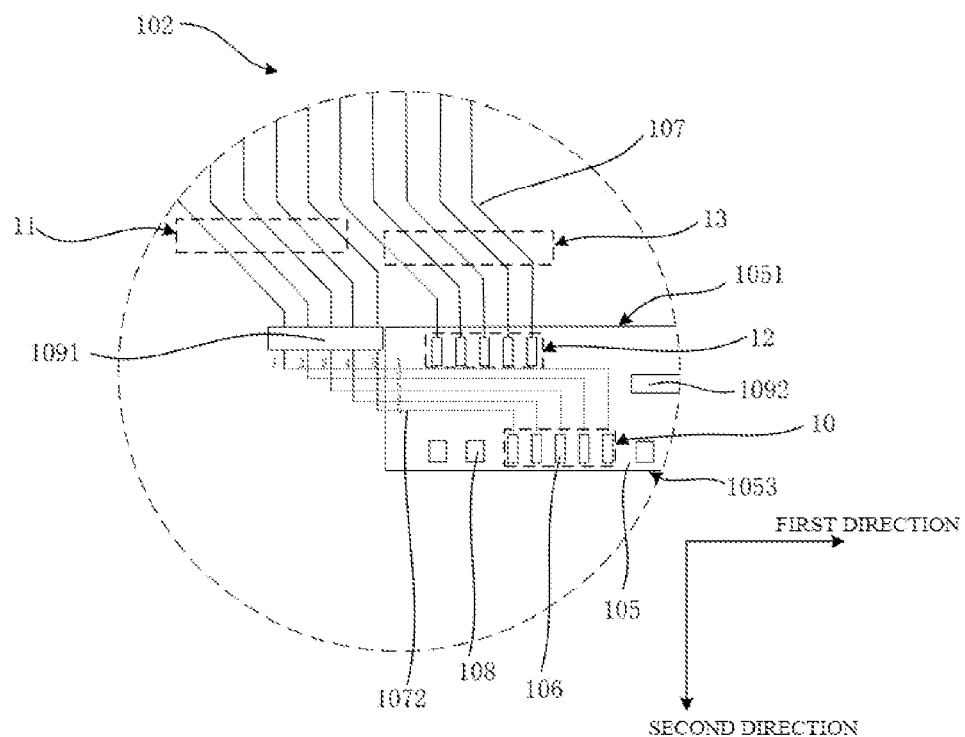
FIG. 12 is a schematic diagram of a seventh partial structure of the non-display area of the display panel provided by an embodiment of the present disclosure.

As an embodiment, please refer to FIG. 12. FIG. 12 is a schematic diagram of a seventh partial structure of the non-display area of the display panel provided by an embodiment of the present disclosure.

Specifically, the output terminals 106 of the second output terminal group 12 are arranged along the extension direction of the first side 1051, and the output terminals 106 of the first output terminal group 10 are arranged along the extension direction of the third side 1053, and at least a part of the output terminals 106 of the second output terminal group 12 are arranged between the plurality of input terminals 108.

Further, referring to FIG. 3, FIG. 6 and FIG. 12, the display panel 100 further comprises a test pad provided on the substrate 1 for image detection of the display panel.

Specifically, before an integrated circuit chip is bound to the display panel 100, data signals and clock signals may be sent to the display area 101 of the display panel 100 through the test pad to realize image detection of the display panel 100. Through the image detection, it can be determined whether the display panel 100 has a display abnormality. If there is a display abnormality, cause of the display abnormality can be found in time and the abnormality can be processed before binding, and the binding can be performed after the display is normal, so as to ensure that display function of the display panel 100 after the binding is normal, which is beneficial to improve production yield of the display panel 100. If the detection is performed after the binding, workload of rework process which will be performed when the display is abnormal is relatively large, and the production yield of the display panel 100 will be greatly reduced.

In order to adapt to the wire-changing jumper design adopted by the fan-out wires 107 in the embodiment of the present disclosure, the test pad in the embodiment of the present disclosure also adopts a sectioned design.

Specifically, the test pad comprises a first section 1091 and a second section 1092, the first section 1091 is located in the fan-out area 104, and the second section 1092 is located in the bonding area 103. Compared with the prior art, in the present disclosure, a part of the test pad is disposed outside the bonding area 103, so that an area of the substrate corresponding to the driving chip 105 leaves more space to layout the fan-out wires 107, which can further reduce the lower frame of the display panel 100.

It is understandable that since the first fan-out sections 1071 are vertical wires, which will not restrict the setting of the test pad, the first section 1091 corresponds to the first fan-out sections 1071, and an orthographic projection of the first section 1091 on the substrate 1 overlaps an orthographic projection of the first fan-out sections 1071 on the substrate 1. The fan-out wires 107 in the first fan-out wire group 11 is electrically connected to the first section 1091 first, and then is electrically connected to the output terminals 106 of the first output terminal group 10. Before binding the driving chip 105, the first section 1091 is configured to provide test signals to the fan-out wires 107 in the first fan-out wire group 11 to detect images.

In contrast, the second fan-out sections 1072 are horizontally routed, which will limit the setting of the test pad, so an orthographic projection of the second section 1092 on the substrate 1 and an orthographic projection of the output terminals 106 and the input terminals 108 on the substrate 1 do not overlap, and the orthographic projection of the second section 1092 on the substrate 1 is located at a side of an orthographic projection of the second output terminal group 12 on the substrate 1 away from the display area 101. The fan-out wires 107 in the second fan-out wire group 13 is first electrically connected to the plurality of output terminals 106 of the second output terminal group 12, and then electrically connected to the second section 1092. The second section 1092 is configured to provide test signals to the fan-out wires 107 in the second fan-out wire group 13 to detect image before the integrated circuit chip is bound.

Figure 13:
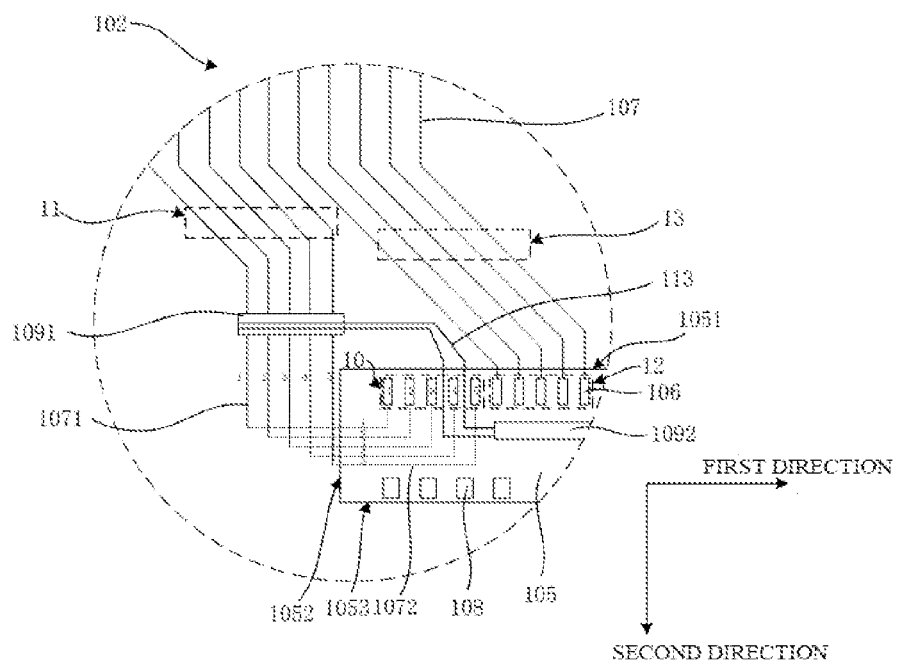
FIG. 13 is a schematic diagram of an eighth partial structure of the non-display area of the display panel provided by an embodiment of the present disclosure.

Further, please refer to FIG. 13. FIG. 13 is a schematic diagram of an eighth partial structure of the non-display area of the display panel provided by an embodiment of the present disclosure. FIG. 13 is an improvement based on FIG. 6, apparently, this improvement can be applied to other embodiments.

The display panel 100 further comprises a plurality of test pad connection wires 113 configured to connect the first section 1091 and the second section 1092. There is a gap between two adjacent output terminals 106 of the first output terminal group 10, and at least a part of the test pad connection wires 113 are connected to the second section 1092 through the gap from a side of the first side 1051 close to the display area 101.

It can be understood that the test pad connection wires 113 are routed on a side of the first side 1051 close to the display area 101, which is beneficial to save space under the first output terminal group 10, thereby increasing a wire space for the fan-out wires 107 in the first fan-out wire group 11, so that a number of the fan-out wires 107 in the second fan-out wire group 13 is reduced, which can further reduce the lower frame of the display panel 100.

Figure 14:
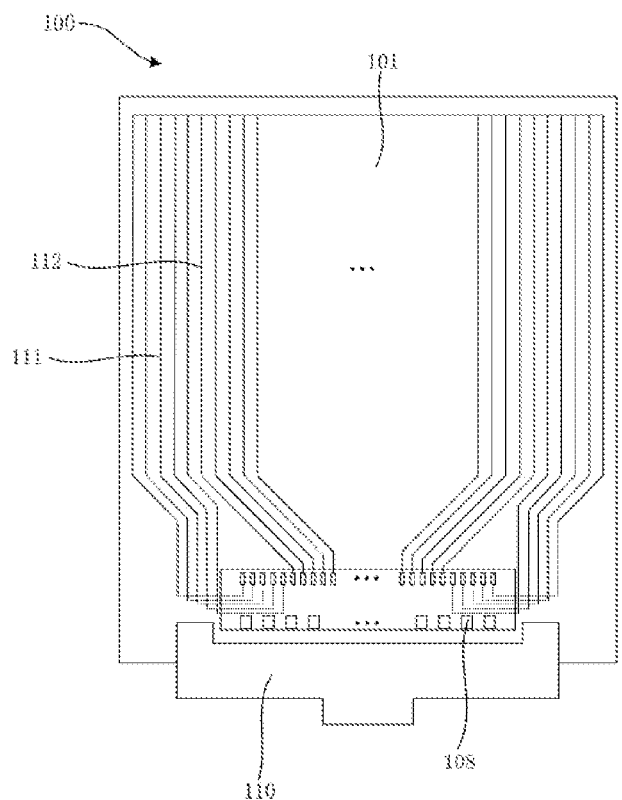
FIG. 14 is a schematic diagram of another planar structure of the display panel provided by an embodiment of the present disclosure.

Please refer to FIG. 14, which is a schematic diagram of another planar structure of the display panel provided by an embodiment of the present disclosure.

Further, the display panel 100 further comprises a flexible circuit board 110 disposed on a side of the driving chip 105 away from the display area 101, and the flexible circuit board 110 is electrically connected to the input terminals 108. Signals transmitted to the display area 101 are usually first transmitted to the input terminals 108 through the flexible circuit board 110, and then transmitted to the output terminals 106 through the input terminals 108 and wires inside the driving chip 105, and transmitted to the display area 101 through the output terminals 106 and the fan-out wires 107.

Further, please continue to refer to FIG. 3 and FIG. 14, the display panel 100 further comprises a plurality of signal wires disposed in the display area 101, and each of the signal wires is electrically connected to a corresponding fan-out wire 107.

In terms of location, the plurality of signal wires comprise first signal wires 111 and second signal wires 112, and the first signal wires 111 are electrically connected to the output terminals 106 of the first output terminal group 10 through the fan-out wires 107 of the first fan-out wire group 11, and the second signal wires 112 are electrically connected to the output terminals of the second output terminal group 12 through the fan-out wires 107 of the second fan-out wire group 13.

From a functional point of view, the plurality of signal wires may comprise a plurality of data signal wires and a plurality of touch signal wires, and an arrangement of the data signal wires is the same as that of the touch signal wires, and the data signal wires are insulated from the touch signal wires. The flexible circuit board 110 in the present disclosure sends touch signals to the touch signal wires through the driving chip 105, and the driving chip 105 sends data signals to the data signal wires.

The embodiment of the present disclosure also provides a display device, the display device comprises the above-mentioned display panel, and the display device can be any products or elements having display function, such as a mobile phone, a tablet computer, a television, a monitor, a notebook computer, a digital photo frame, a navigator, etc.

Beneficial effects are: in the display panel and the display device provided by the embodiments of the present disclosure, the plurality of fan-out wires are disposed in the fan-out area of the display panel, and the plurality of fan-out wires comprise at least the first fan-out wire group. Each fan-out wire in the first fan-out wire group extends from the fan-out area to the bonding area, and is electrically connected to the corresponding output terminal in the first output terminal group through the adjacent second side. Each fan-out wire in the first fan-out wire group of the present disclosure adopts the wire-changing jumper design, and each fan-out wire in the first fan-out wire group comprises the first fan-out section and the second fan-out section that are connected and located on different layers, each first fan-out section is electrically connected to the display area, and each second fan-out section is electrically connected to the corresponding output terminal in the first output terminal group. Under the premise of realizing the narrow frame, the fan-out wires are electrically connected to the corresponding output terminals, which prevents the short circuit between the plurality of fan-out wires, and prevents poor display caused by signal disorder due to inconsistent orders of the output terminals and the fan-out wires.

In summary, although preferred embodiments have been described above in the present disclosure, the above-mentioned preferred embodiments are not intended to limit the present disclosure. Those of ordinary skilled in the art can make various modifications and changes without departing from the spirit and scope of the present disclosure. Therefore, the protection scope of the present disclosure is subject to the scope defined by the claims.

What is claimed is:

1. A display panel, which comprises a substrate, wherein the substrate comprises a display area and a non-display area surrounding the display area, and the non-display area comprises a bonding area and a fan-out area connecting the bonding area and the display area;
   wherein the bonding area is provided with a driving chip, the driving chip comprises a first side adjacent to the display area and two second sides connected to the first side, the driving chip comprises a plurality of output terminals, and the plurality of output terminals comprises at least a first output terminal group;
   wherein the fan-out area is provided with a plurality of fan-out wires, and the plurality of the fan-out wires comprise at least a first fan-out wire group, and each of the plurality of fan-out wires in the first fan-out wire group extends from the fan-out area to the bonding area and is electrically connected to a corresponding one of the output terminals in the first output terminal group through an adjacent one of the second sides, wherein orthographic projections of the plurality of fan-out wires in the first fan-out wire group cross each other in the bonding area;
   wherein each of the plurality of fan-out wires in the first fan-out wire group comprises a first fan-out section and a second fan-out section, the first fan-out section and the second fan-out section of each fan-out wire in the first fan-out wire group are connected to each other and located in different layers, each of the first fan-out sections is electrically connected to the display area, and each of the second fan-out sections is electrically connected to a corresponding output terminal in the first output terminal group;
   wherein ends of the second fan-out sections that are not connected to the first fan-out sections extend toward the display area, an arrangement sequence of the ends of the second fan-out sections that are not connected to the first fan-out sections is same as an arrangement sequence of the output terminals in the first output terminal group, establishing a sequence-matching connection between these ends of the second fan-out sections and the output terminals in the first output terminal group.

2. The display panel of claim 1, wherein the plurality of second fan-out sections are electrically connected to the corresponding output terminals in the first output terminal group through the adjacent one of the second sides; and
   the plurality of first fan-out sections are arranged along a preset direction, and the ends of the plurality of second fan-out sections that are not connected to the first fan-out sections are arranged along the preset direction, in the preset direction, an arrangement sequence of the first fan-out sections is same as the arrangement sequence of the ends of the second fan-out sections that are not connected to the first fan-out sections; and
   wherein the preset direction is perpendicular to a direction from the display area towards the fan-out area.

3. The display panel of claim 1, wherein the plurality of first fan-out sections are connected to corresponding second fan-out sections through the adjacent one of the second sides, and the plurality of second fan-out sections are electrically connected to the corresponding output terminals in the first output terminal group; and
   ends of the plurality of first fan-out sections that are not connected to the second fan-out sections are arranged along a preset direction, and the plurality of second fan-out sections are arranged along the preset direction, in the preset direction, an arrangement sequence of the ends of the first fan-out sections that are not connected to the second fan-out sections is same as an arrangement sequence of the second fan-out sections correspondingly connected to the first fan-out sections; and the preset direction is perpendicular to a direction in which the display area points to the fan-out area.

4. The display panel of claim 1, wherein the plurality of output terminals further comprise a second output terminal group, and the plurality of fan-out wires further comprise a second fan-out wire group; each fan-out wire of the second fan-out wire group is electrically connected to a corresponding one of the output terminals in the second output terminal group.

5. The display panel of claim 4, wherein the plurality of output terminals of the first output terminal group and a plurality of output terminals of the second output terminal group are along an extension direction of the first side, and the second output terminal group is disposed on a side of the first output terminal group away from the adjacent one of the second sides.

6. The display panel of claim 4, wherein the plurality of output terminals of the first output terminal group and a plurality of output terminals of the second output terminal group are along an extension direction of the first side, and at least a part of the output terminals of the second output terminal group are disposed on a side of the first output terminal group close to the adjacent second side.

7. The display panel of claim 4, wherein the plurality of output terminals of the first output terminal group are arranged along an extension direction of the adjacent second side, and a plurality of output terminals of the second output terminal group are arranged along an extension direction of the first side.

8. The display panel of claim 4, wherein the output terminals of the second output terminal group are arranged along an extension direction of the first side, and the output terminals of the first output terminal group are located at a side of the output terminals of the second output terminal group away from the display area.

9. The display panel of claim 4, wherein the display panel further comprises a test pad disposed on the substrate, the test pad comprises a first section and a second section, the first section is located in the fan-out area, and the second section is located in the bonding area.

10. The display panel of claim 9, wherein an orthographic projection of the first section on the substrate overlaps an orthographic projection of the first fan-out sections on the substrate, and an orthographic projection of the second section on the substrate is located on a side of an orthographic projection of the second output terminal group on the substrate away from the display area.

11. The display panel of claim 10, wherein the display panel further comprises a plurality of test pad connection wires for connecting the first section and the second section; there is a gap between two adjacent output terminals of the first output terminal group, and at least a part of the test pad connection wires are connected to the second section through the gap from a side of the first side close to the display area.

12. The display panel of claim 4, wherein the driving chip further comprises a third side far away from the display area; and the driving chip further comprises a plurality of input terminals, and the plurality of input terminals are arranged along an extension direction of the third side.

13. The display panel of claim 12, wherein the output terminals of the second output terminal group are arranged along an extension direction of the first side, and the output terminals of the first output terminal group are arranged along the extension direction of the third side.

14. The display panel of claim 13, wherein at least a part of the output terminals of the first output terminal group are arranged between the plurality of the input terminals.

15. The display panel of claim 12, wherein the display panel further comprises a flexible circuit board disposed on a side of the driving chip away from the display area, and the flexible circuit board is electrically connected to the input terminals.

16. A display device, which comprises a display panel, wherein the display panel comprises a substrate, the substrate comprises a display area and a non-display area surrounding the display area, and the non-display area comprises a bonding area and a fan-out area connecting the bonding area and the display area;
   wherein the bonding area is provided with a driving chip, the driving chip comprises a first side adjacent to the display area and two second sides connected to the first side, the driving chip comprises a plurality of output terminals, and the plurality of output terminals comprises at least a first output terminal group;
   wherein the fan-out area is provided with a plurality of fan-out wires, and the plurality of the fan-out wires comprise at least a first fan-out wire group, and each of the fan-out wires in the first fan-out wire group extends from the fan-out area to the bonding area and is electrically connected to a corresponding one of the output terminals in the first output terminal group through an adjacent one of the second sides, wherein orthographic projections of the plurality of fan-out wires in the first fan-out wire group cross each other in the bonding area;
   wherein each of the fan-out wires in the first fan-out wire group comprises a first fan-out section and a second fan-out section, the first fan-out section and the second fan-out section of each fan-out wire in the first fan-out wire group are connected to each other and located in different layers, each of the first fan-out sections is electrically connected to the display area, and each of the second fan-out sections is electrically connected to a corresponding output terminal in the first output terminal group;
   wherein ends of the second fan-out sections that are not connected to the first fan-out sections extend toward the display area, an arrangement sequence of the ends of the second fan-out sections that are not connected to the first fan-out sections is same as an arrangement sequence of the output terminals in the first output terminal group, establishing a sequence-matching connection between these ends of the second fan-out sections and the output terminals in the first output terminal group.

17. The display device of claim 16, wherein the plurality of second fan-out sections are electrically connected to the corresponding output terminals in the first output terminal group through the adjacent one of the second sides; and
   the plurality of first fan-out sections are arranged along a preset direction, and the ends of the plurality of second fan-out sections that are not connected to the first fan-out sections are arranged along the preset direction, in the preset direction, an arrangement sequence of each of the first fan-out sections is same as the arrangement sequence of the ends of the second fan-out sections that are not connected to the first fan-out sections; and wherein the preset direction is perpendicular to a direction from the display area towards the fan-out area.

18. The display device of claim 16, wherein the plurality of first fan-out sections are connected to the corresponding second fan-out sections through the adjacent one of the second sides, and the plurality of second fan-out sections are electrically connected to the corresponding output terminals in the first output terminal group; and ends of the plurality of first fan-out sections that are not connected to the second fan-out sections are arranged along a preset direction, and the plurality of second fan-out sections are arranged along the preset direction, in the preset direction, an arrangement sequence of the ends of the first fan-out sections that are not connected to the second fan-out sections is same as an arrangement sequence of the second fan-out sections correspondingly connected to the first fan-out sections; and the preset direction is perpendicular to a direction from the display area towards the fan-out area.

19. The display device of claim 16, wherein the plurality of output terminals further comprise a second output terminal group, and the plurality of fan-out wires further comprise a second fan-out wire group; each fan-out wire of the second fan-out wire group is electrically connected to a corresponding one of the output terminals in the second output terminal group.

20. The display device of claim 19, wherein the plurality of output terminals of the first output terminal group and a plurality of output terminals of the second output terminal group are along an extension direction of the first side, and the second output terminal group is disposed on a side of the first output terminal group away from the adjacent one of the second sides.

* * * * *